(12) United States Patent
Wang et al.

(10) Patent No.: US 7,045,803 B2
(45) Date of Patent: May 16, 2006

(54) MISSING DIE DETECTION

(75) Inventors: Fan Wang, Kwai Chung (CN); Wing Hong Leung, Kwai Chung (CN)

(73) Assignee: ASM Assembly Automation Ltd., (HK)

( * ) Notice: Subject to any disclaimer, the term of this patent is extended or adjusted under 35 U.S.C. 154(b) by 122 days.

(21) Appl. No.: 10/618,297

(22) Filed: Jul. 11, 2003

(65) Prior Publication Data

US 2005/0006606 A1    Jan. 13, 2005

(51) Int. Cl.
*G01N 21/86* (2006.01)
*G01V 8/00* (2006.01)

(52) U.S. Cl. .................... 250/559.4; 250/215; 356/614
(58) Field of Classification Search ................ 250/215, 250/559.4
See application file for complete search history.

(56) References Cited

U.S. PATENT DOCUMENTS 3,814,931 A * 6/1974 Kuroda et al. .......... 250/223 R
6,153,887 A * 11/2000 Furuta ..................... 250/559.4

FOREIGN PATENT DOCUMENTS

JP            03208348 A  *  9/1991

* cited by examiner

*Primary Examiner*—Stephone B. Allen
*Assistant Examiner*—Patrick J. Lee
(74) *Attorney, Agent, or Firm*—Ostrolenk, Faber, Gerb & Soffen, LLP

(57) ABSTRACT

An indication of whether or not a target object is present at a site of a collet assembly is derived by monitoring light reflected from the site. The use of reflected light enables the presence of objects to be detected, especially transparent objects. In a preferred arrangement for determining if a sapphire die is present in a die-handling collet assembly, light from a source is collimated or focused into a narrow beam and directed through a beam splitter at the target site of the collet assembly. Light reflected from the surface of the die is further reflected by the beam splitter toward a photosensor. The reflected light is measured when the collet passes over a dark background while on the way to deliver a die at a bonding position and again while returning after attempting to place the die at the bonding position. A determination of a die present in the former and absent in the latter is indicative of a well-placed die at the bonding position.

40 Claims, 4 Drawing Sheets

MISSING DIE DETECTION

FIELD OF INVENTION

The present invention relates generally to the detection of objects and to the manufacture of semiconductor devices from silicon or sapphire wafers, and more particularly to apparatus and methods for the detection of missing dice, for example when picking dice up from a wafer and placing the dice at a bonding position.

BACKGROUND

After fabrication and dicing of devices formed on a wafer, the individual dice are picked up from the diced wafer by a collet in a pickup head and placed in a bonding position on a carrier, substrate or other device, for further processing.

To avoid the omission of dice from production units it is desirable to raise an alarm if the pickup head fails to pick up and place a die at the bonding location.

Known detection systems generally use a light source and a light sensor which are aligned and placed on opposite sides of the site where the presence or absence of an object, for example the die, is to be detected. The presence of the object at the site interferes with transmittance of a narrow beam of light (whether collimated or focused) from the source to the sensor. The detection by the sensor of light radiated from the source is used an indication that the object is not present at the site. Conversely, the absence of light radiated from the source and detected by the sensor is used an indication that the object is present at the site.

However, these known systems fail in the case of transparent, or even partially transparent, objects where light can be transmitted through the object, and a relatively strong signal can still be received by the sensor even when the object is present.

SUMMARY OF INVENTION

It is an object of one embodiment of the invention to provide an apparatus for determining if an object is missing, which apparatus reduces the occurrence of false indications, or at least provides the public with a useful choice.

It is an object of a second embodiment of the invention to provide a method for determining if an object is missing, which method reduces the occurrence of false indications, or at least provides the public with a useful choice.

In one aspect the invention may be broadly said to be an apparatus for detecting the presence or absence of a target object at a site of a collet assembly, the apparatus including a source of light adapted for illuminating at least a portion of the site, and a light detector adapted for receiving at least a part of the light from the source when reflected by a target object located at the site.

Optionally the apparatus is adapted for detecting the presence of the target object at the site when the target object presents a surface substantially at a predetermined orientation, wherein the illumination is incident upon the portion of the site substantially normal to said orientation.

Optionally the apparatus includes a beam splitter, and light from the source travels through the beam splitter to illuminate the portion of the site, and said light reflected by the target object is further reflected, by the beam splitter, toward the light detector.

Alternatively, a beam splitter reflects light from the source toward the portion of the site and the light reflected by the target object travels through the beam splitter to the light detector.

The light detector may be an image sensor or a power sensor.

The light may be visible or invisible radiation.

Light from the source may be collimated or focused into a beam for illuminating the portion of the site.

Optionally the illuminating beam is approximately 0.02 to 0.5 mm wide at the portion of the site, and most preferably 0.05 mm.

Optionally the source of illuminating light and the light detector are both on one side of the site and a dark background is located on the opposite side of the site.

The target object may be substantially transparent.

The target object may have a refractive index not equal to 1.

Optionally the refractive index is approximately 1.55.

Either or both of the source of light and the light detector may be located remotely from the collet assembly.

In a second aspect the invention may be broadly said to be a die handling device including a collet assembly for holding a die, and an apparatus according to the first aspect or any of the options of the first aspect, wherein the die is the target object.

In a third aspect the invention may be broadly said to be a method of determining the presence or absence of a target object at a site of a collet assembly, including the steps of:
(a) illuminating at least a portion of the site,
(b) arranging a light detector to receive at least a part of the illuminating light when reflected by a target object located the site, and
(c) detecting said illuminating light reflected by said target object and received by said detector.

Optionally the method determines the presence of the target object at the site when the target object presents a surface substantially at a predetermined orientation, and said illuminating light is incident upon said portion of the site substantially normal to said orientation.

Optionally the method includes the further steps of:
(d) passing said illuminating light through a beam splitter to illuminate said portion of the site, and
(e) further reflecting said light reflected by the target object, by the beam splitter, toward the light detector.

Optionally the method includes the further steps of:
(f) reflecting light from said source toward said portion of said site, by a beam splitter, and
(g) passing said light reflected by the target object through the beam splitter to the light detector.

The light detector may be an image sensor or a power sensor.

The light may be visible or invisible radiation.

Optionally the method includes the further step of:
(h) collimating or focusing the illuminating light into a beam for illuminating said portion of the site.

Preferably the illuminating beam is approximately 0.02 to 0.5 mm wide at the portion of the site, and most preferably 0.05 mm.

Preferably the detection of the reflected illuminated light in step (c) is made with a dark background in the direction opposite to that in which light is reflected by the target object located at the site.

The target object may be substantially transparent.

Optionally the target object has a refractive index that is not equal to 1.

Preferably the refractive index is approximately 1.55.

Optionally the method includes the further steps of:
(j) making an attempt to pick up an object with the collet assembly, (k) illuminating a predetermined site at the collet assembly, (l) arranging a detector to detect illuminating light reflected from said site at the collet assembly, (m) making a determination of the presence or absence of the object at the site at the collet, the determination being based on the light detected by the detector.

Preferably the detection of light reflected from the site in step (l) is made with a dark background in the direction opposite to that in which light is reflected by the object when located at the site.

The invention may further be said to consist in any alternative combination of parts or features mentioned herein or shown in the accompanying drawings. Known equivalents of these parts or features which are not expressly set out are nevertheless deemed to be included.

BRIEF DESCRIPTION OF DRAWINGS

Preferred embodiments of the invention will now be described, by way of example only and without intending to be limiting, with reference to the drawings of which.

DETAILED DESCRIPTION OF THE PREFERRED EMBODIMENTS

Figure 1:
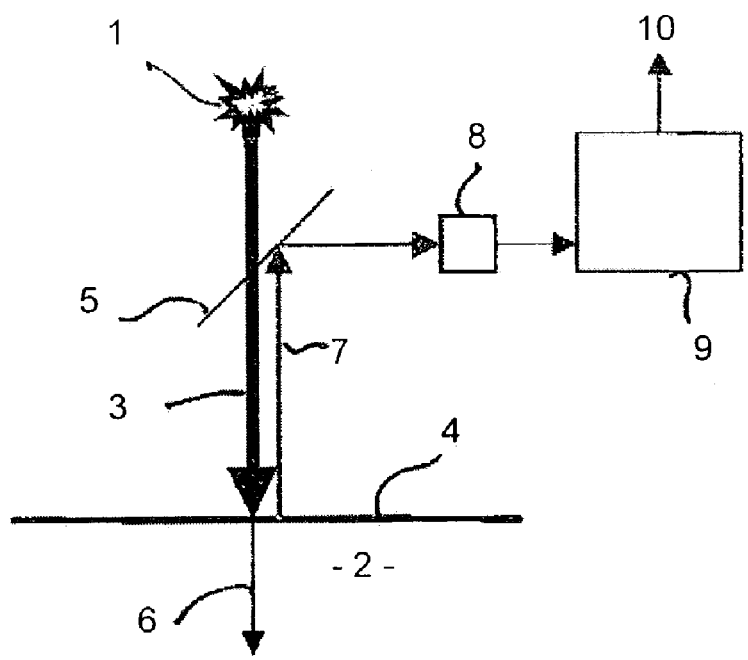
FIG. 1 shows a schematic diagram of a first preferred embodiment of an optical arrangement for determining the presence or absence of a die at a predetermined location, in accordance with the current invention.

Referring to the drawings it will be appreciated that a method and apparatus for detecting the presence or absence of an object at a predetermined location can be implemented in various forms. The following embodiments are described by way of example only.

References herein to 'light' are not intended to be limited to visible light but are to be understood as also including non-visible radiation, including infrared and ultraviolet radiation having wavelengths outside the visible spectrum, for example. References to 'reflection' include scattering of light or radiation from a surface.

FIG. 1 shows a schematic diagram of a first preferred embodiment of an optical arrangement for determining the presence or absence of a die at a predetermined location. In this embodiment the predetermined location is at a die-handling collet of a collet assembly for die placement. The collet assembly is used to pick up individual dice fabricated from a silicon or sapphire wafer, and to place the dice at a bonding position where, for example, the die is attached to a substrate, such as a lead frame.

A light source 1, for example a laser diode, is arranged to illuminate at least a portion of a site in the collet. As shown in FIG. 1, the site is occupied by a die 2. The light from the source is preferably collimated or focused, such as by a lens 22 (see FIG. 3) into a narrow incident beam 3. In a preferred application the collimated or focused beam is between 0.02 to 0.5 mm wide, and most preferably 0.05 mm wide. The incident beam is directed through the collet, whose inner diameter can be as small as 0.02 mm, at a small portion of the die 2. Noise caused by reflections of light from the inner surface of the collet other than at the die site in the collet, are minimised by making the diameter of the beam sufficiently small so that very little, other than the die, is illuminated.

In the case shown in FIG. 1, the illuminating light is incident upon the surface 4 of the die substantially normal to the orientation of the surface 4. However, other angles of incident light that are close to normal incidence may be used, in which case the light will be reflected from the die surface at a corresponding angle, as long as angles of incidence and reflection are sufficiently small to allow the light to be received. The light source illuminates the die surface after passing through a beam splitter 5. In the case shown in FIG. 1, where the die 2 is transparent, a major fraction 6 of the light is transmitted through the die 2. However, a smaller fraction 7 of the incident source light is reflected from the die surface 4 back toward the beam splitter 5 which reflects the light to a light detector, which may be in the form of a photo-sensor 8. FIG. 1 shows this reflected fraction or beam 7 offset from the incident beam 3. This offset is only shown for clarity of the explanation provided by FIG. 1, and in practice the incident and reflected beams coincide, at least at the die surface 4.

An output signal from the photo-sensor 8 is connected to an electronic amplifier 9 which produces an amplified output 10 for further processing to make a determination of the presence or absence of a die at the collet, based on the light received by the photo-sensor 8.

The photo-sensor 8 can be an image sensor or a general light power sensor.

In the case of the preferred application, where the optical arrangement monitors the presence or absence of a die fabricated from a wafer made of sapphire, the die is substantially transparent. In general, the reflectivity R of a surface of a transparent body can be expressed as:

$$R = \left(\frac{(n-1)}{(n+1)}\right)^2$$

where n is the refractive index of the transparent body.

Typically for sapphire, n is between 1.55 to 1.7. If n=1.55, then R=0.047 (or 4.7%). However reflection occurs at both the top and bottom surfaces of the sapphire die giving a total reflectivity of about 9.4%. Thus, even if the die is substantially transparent and as long as its refractive index is not equal to 1, the die will still reflect a fraction of the incident light beam back for detection by the photo-sensor. This reflectivity by the die allows a determination of the presence or absence of a transparent object such as a sapphire die in the collet to be based upon reflected rather than the traditional transmitted light. Determination based upon scattering of light by an object is also possible, as long as an intensity of the scattered light is sufficient to reach the photo-sensor.

Figure 2:
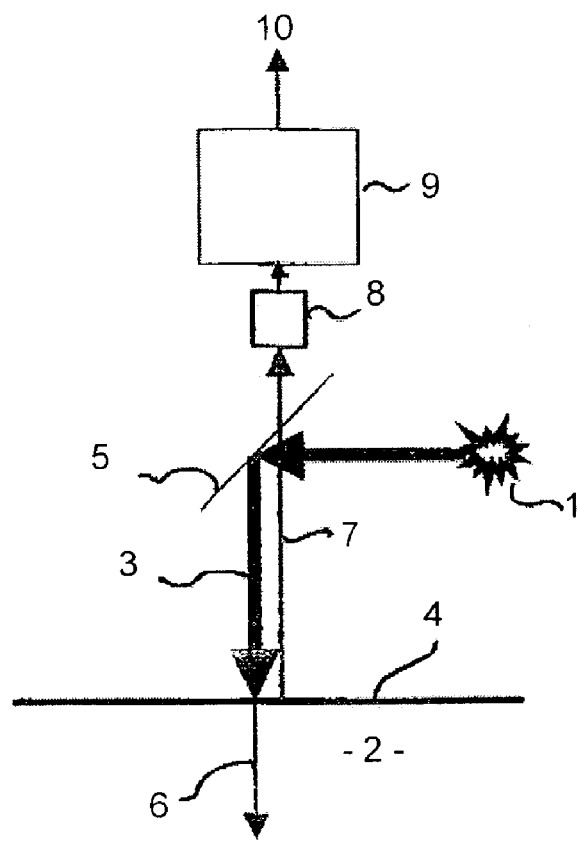
FIG. 2 shows a schematic diagram of a second alternative embodiment to that of FIG. 1.

A second arrangement is shown in FIG. 2. Corresponding features in FIGS. 1 and 2 are labelled alike. In this arrangement the positions of the illuminating light source 1 and the photo-sensor 8 are interchanged, so that light from the illuminating source 1 is directed to the beam splitter 5 which reflects the incident beam 3 toward the surface 4 of the die 2. A major fraction 6 of the incident light is transmitted through the die, while a minor fraction 7 of the incident light is reflected back through the beam splitter 5 to the photo-sensor 8.

Figure 3:
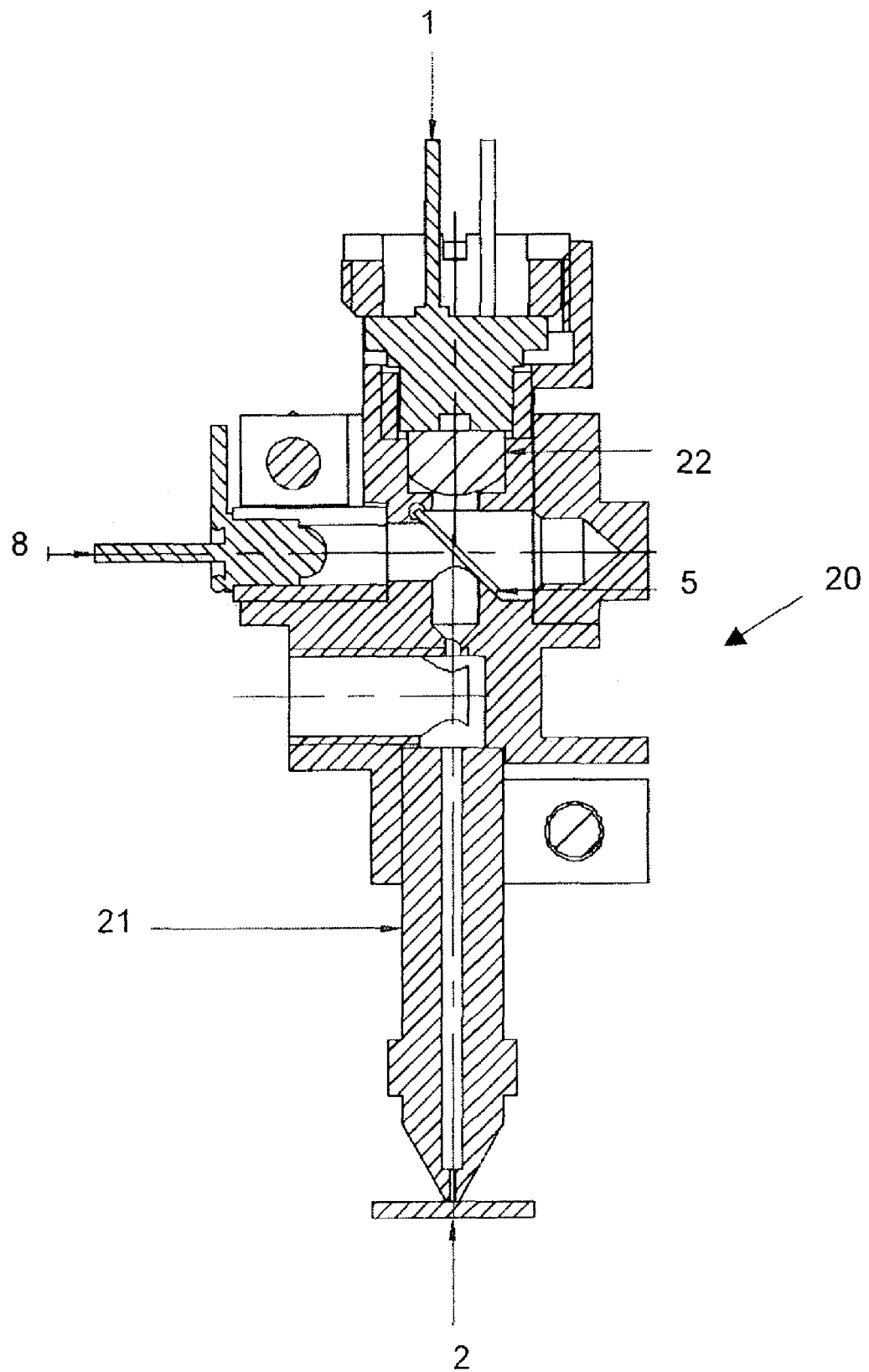
FIG. 3 shows a cross-sectional side view of a collet assembly utilising the arrangement of the first preferred embodiment.

FIG. 3 shows a cross-sectional side view of a collet assembly 20 utilising the arrangement of the first preferred embodiment. The light source or laser diode 1 is arranged at the top of the collet assembly 20 to project a beam of light through the collet assembly 20. The light from the source is collimated or focused by a lens 22 into a narrow incident beam. The incident beam passes through the beam splitter 5 and is directed through the collet 21 such that at least a portion of a site at the opening of the collet 21 is illuminated. A die 2 is located at the said opening. The incident beam is reflected from the surface of the die 2 back toward the beam splitter 5 which reflects the light to the photo-sensor 8. In FIG. 3, the light source 1 and photo-sensor 8 are integrated with and located on the collet assembly 20.

Figure 4:
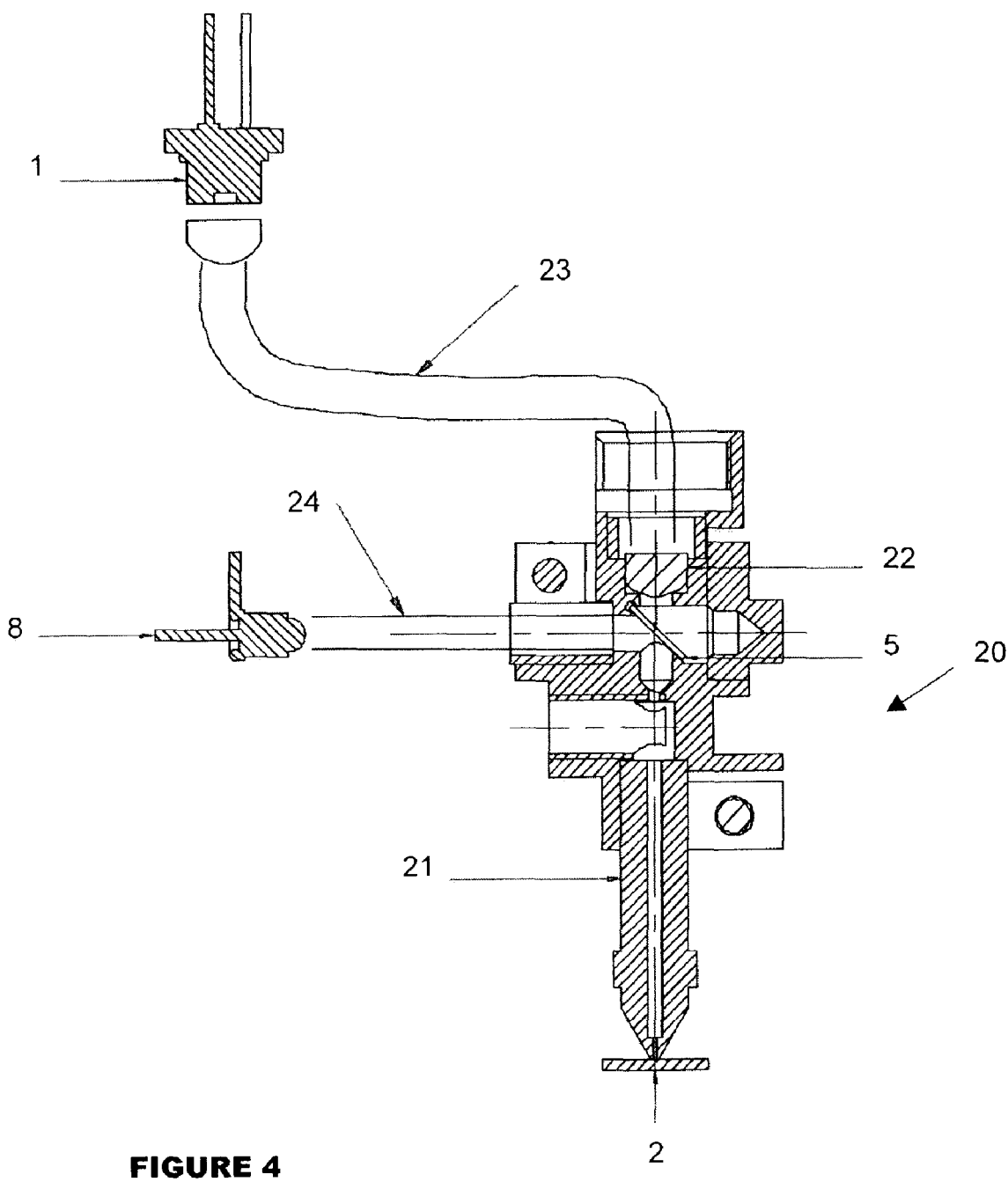
FIG. 4 shows a cross-sectional side view of a collet assembly where a light source and light detector are located remotely from the collet assembly.

FIG. 4 shows a cross-sectional side view of a collet assembly 20 where the light source 1 and light detector 8 are located remotely from the collet assembly 20. An optical fibre 23 is used to direct incident light from the remotely located laser diode 1 to the surface of the die 2 at the collet 21. Another optical fibre 24 is used to direct light reflected from the surface of the die 2 to the photo-sensor 8, which is also remotely located. In another alternative arrangement (not shown), a single fibre directs both incident light to, and reflected light from, the die.

In alternative arrangements (not shown), optical systems such as light guides, mirrors, etc, can be used to direct the incident light from the light source 1, or to direct light reflected by the die surface back to the photo-sensor 8. An advantage of using optical fibres 23, 24 is that the light source and/or the sensor need not be mounted on the collet assembly 20 so that heavier and more complicated designs can be used without burdening a bond arm controlling it. It should be appreciated that either or both of the light source 1 and the photo-sensor 8 may be mounted on the collet assembly 20 or may be located remotely.

Figure 5:
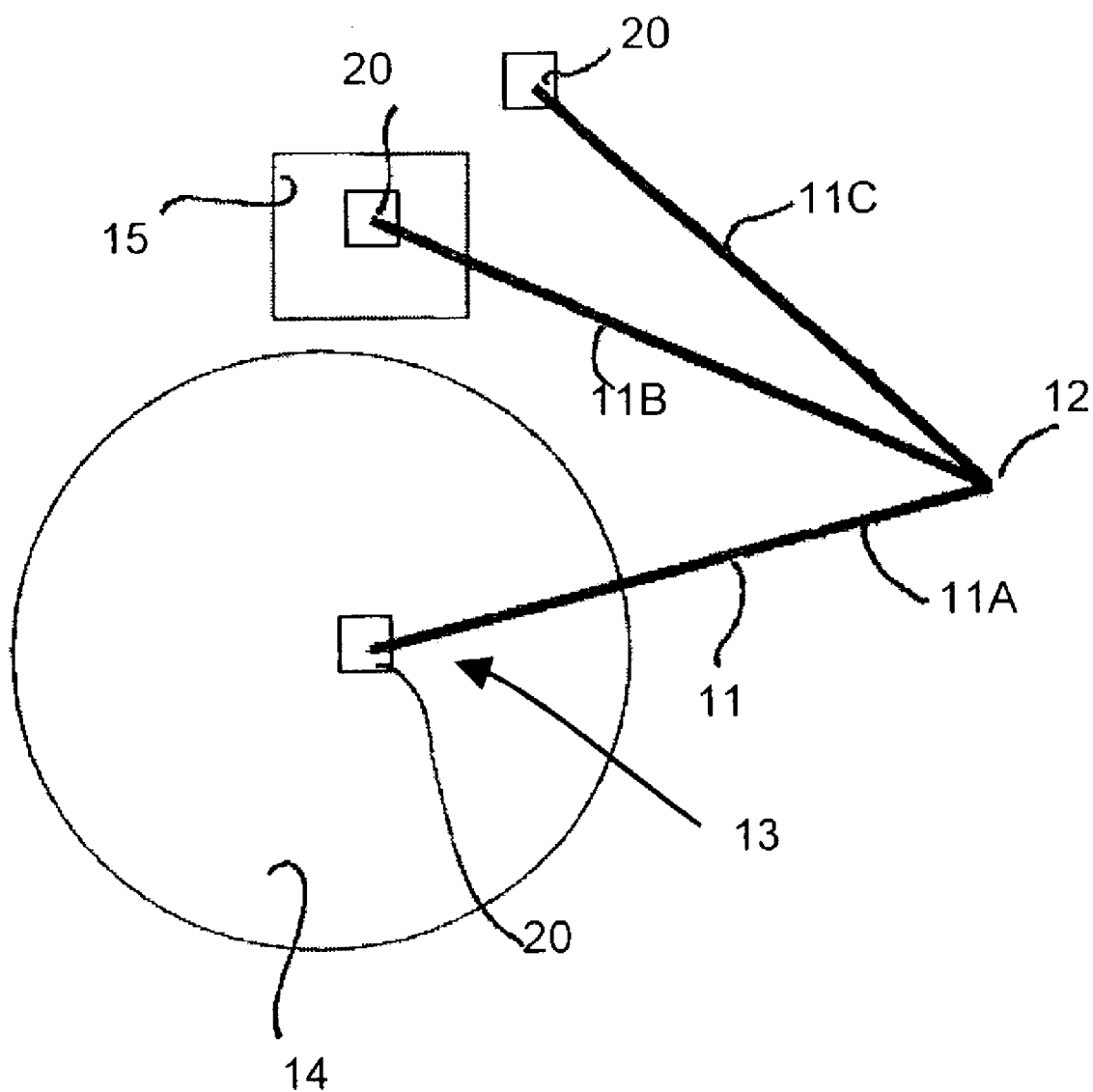
FIG. 5 shows a schematic plan view of a die placement apparatus which incorporates the current invention.

FIG. 5 is a schematic view of the layout of a placement apparatus that uses the missing die detection arrangements described above. A bond arm 11 is mounted to rotate about an axis 12. A collet assembly 20 is carried at the distal end 13 of the bond arm.

The illuminating light source and the photo-sensor are mounted in the collet assembly 20. The illuminated light is collimated or focused into a beam providing a small spot size which is projected through the collet and onto the position to be occupied by a die. Signal-to-noise ratio of the detecting signal is high because background noise is reduced by the use of the collimated or focused beam and small spot size.

FIG. 5 shows the bond arm 11 in three positions. In a first bond arm position 11A, the pick-up head and collet are located over a selected die (not shown) on a sapphire wafer 14 on which individual dice have been fabricated and diced. The collet is operated in an attempt to pick up the selected die and the bond arm 11 is rotated to move the collet toward a third bond arm position 11C.

The sapphire wafer has a highly specular surface which can interfere with measurements of light reflected from an individual die above the wafer. Therefore, a dark background 15 is arranged under an intermediate second position 11B through which the bond arm moves when passing from the first position 11A to a third position 11C.

While the collet is moving over the dark background, the photo-sensor signal processor is triggered, for example by a signal from a host controller or a bond arm controller, to make a measurement of light reflected from the die, if present, in the collet. The measurement is undertaken while the bond arm keeps moving as it is moving over the dark background. The measurement is compared to a reference signal, representing a reference level of detected light intensity in the absence of a die plus a reasonable margin, that can be manually preset or automatically learned by the signal processor.

If the reflection measurement is greater than the reference signal this is taken as an indication that a die is present in the collet, otherwise a missing die alarm is raised and the bond arm is returned to the first bond arm position 11A, to make another attempt to pick up a die.

If the indication derived from the reflection measurement is that a die is present in the collet, the bond arm continues moving to the third bond arm position 11C at which the collet is released to place the die in a bonding position.

The bond arm then begins to return back to the first bond arm position 11A. While the collet is returning over the dark background 15, the photo-sensor signal processor is again triggered to make a second measurement of light reflected from the die, if present, in the collet. Again the measurement is undertaken while the bond arm keeps moving and the measurement compared to the reference signal.

If the reflection measurement is less than the reference signal this is taken as an indication that a die is not present in the collet, and that the die was well placed. Otherwise, a reflection signal greater than the reference is taken as an indication that the die was not placed and an unplaced die alarm is raised.

If the reflection measurement is less than the reference signal, indicating that a die is not present in the collet, then the reference signal may be replaced by this reflection measurement with a reasonable margin added. In this way the reference signal may be continually updated to accommodate variations in ambient conditions, for example background light levels, and to accommodate drift of the apparatus performance parameters, for example in the light source and the photo-sensor.

The bond arm returns to the first position 11A to complete one die placement cycle. Although the embodiment refers to a transparent die, it should be appreciated that a presence of a non-transparent die can also be detected by an apparatus and method according to the invention.

The foregoing describes the invention including preferred forms thereof. Alterations and modifications as will be obvious to those skilled in the art are intended to be incorporated within the scope hereof as defined in the accompanying claims.

The invention claimed is:

1. A method for determining the presence or absence of a target object at a holding site on a collet assembly, the collet assembly including collet which is operable to pickup the target object at a first location and to hold the target object at the holding site, and which is adapted to be moved from the first location to a second location to which the target object is to be transported, and to deposit the target object at the second location, the method comprising the steps of:
   illuminating at least a portion of the holding site;
   arranging a light detector to receive illuminating light reflected from the target object if it is present at the holding site and to provide an output representative of the reflected light; and
   determining the presence or absence of the target object at the holding site on the basis of the detector output,
   wherein at least one of the illuminating light and the light received by the detector moves with the collet when the collet is moved from the first to the second location.

2. A method as claimed in claim 1, wherein:
the holding site is configured to hold the target object with a surface thereof substantially at a predetermined orientation; and
said illuminating light is incident upon said portion of the site substantially normal to said orientation.

3. A method for handling a target object, comprising the steps of:
providing a collet assembly, the collet assembly including a collet which is operable to pick up the target object at a first location and to hold the target object at a holding site thereon, to move from the first location to a second location to which the target object is to be transported, and to deposit the target object at the second location:
providing a light source operable to illuminate at least a portion of the holding site;
arranging a light detector to receive illuminating light reflected from the target object if it is present at the holding site;
making an attempt to pick up the target object at the first location with the collet;
then moving the collet from the first to the second location;
moving at least one of the light provided by the light source and the light received by the detector with the collet while the collet is moved from the first to the second location; and
detecting the presence or absence of the target object at the holding site by:
illuminating the holding site with light from the light source after the attempt has been made to pick up the target object and detecting any light received by said detector resulting from said illumination; and
making a determination of the presence or absence of the target object at the holding site based on an output signal from the detector.

4. A method as claimed in claim 3, wherein the determination of the presence or absence of the target object at the holding site is made by comparing the detector output against a stored reference value representing the absence of the target object.

5. A method as claimed in claim 3, further including the step of:
moving the collet to the second location and attempting to deposit the target object at the second location if it has been detected at the holding site; or
making another attempt to pick up the target object at the first location if it has not been detected at the holding site.

6. A method as claimed in claim 4, wherein:
after the attempt to deposit the target object at the second location, the step of detecting the presence or absence of the target object at the holding site is repeated; and
if the target object is detected at the holding site, making another attempt to deposit the target object at the second location; or
if the target object is not detected at the holding site, making an attempt to pick up another target object at the first location.

7. A method as claimed in claim 6, wherein:
the determination of the presence or absence of the target object at the holding site is made by comparing the detector output against a stored reference value representing the absence of the target object; and
after the step of detecting the presence or absence of the target object at the holding site has been repeated, if the target object is not detected at the holding site, substituting data representing the output of the detector for the repeated detection step for the stored data before making the attempt to pick up another target object at the first location.

8. A method as claimed in claim 7, wherein the detection step is performed at a location between the first and second locations.

9. A method as claimed in claim 3, wherein the detection step is performed at a location between the first and second locations.

10. A method as claimed in claim 9, wherein the detection step is performed against a dark background.

11. A collet assembly comprising:
a collet having a holding site thereon, wherein the collet is operable to pick up a target object at a first location and to hold the target object on the holding site, and is adapted to be moved from the first location to a second location to which the target object is to be transported, and to deposit the target object at the second location; and
an apparatus for detecting the presence or absence of the target object at the holding site comprising:
a source of light for illuminating at least a portion of the holding site; and
a light detector for receiving illuminating light reflected from the target object if it is present at the holding site,
wherein at least one of the light from the light source and the light received by the detector moves with the collet while the collet moves from the first to the second location.

12. Apparatus as claimed in claim 11, wherein the detection of the presence or absence of the target object at the holding site is performed at a third location between the first and second locations.

13. Apparatus as claimed in claim 12, further including a dark background at the third location against which the detection of the presence or absence of the target object at the holding site is performed.

14. Apparatus including, in combination:
a collet assembly as defined in claim 11, operable to pick up, hold, transport and deposit a target object; and
a mechanism operable to move the collet from the first to the second location.

15. Apparatus including, in combination:
a collet assembly as defined in claim 11, operable to pick up, hold, transport and deposit a die as the target object; and
a mechanism operable to move the collet from the first to the second location.

16. An apparatus as claimed in claim 11, wherein:
said holding site is configured to hold said target object with a surface thereof substantially at a predetermined orientation; and
said illumination is incident upon said portion of the site substantially normal to said orientation.

17. An apparatus as claimed in claim 11, further including a beam splitter, wherein light from said source travels through the beam splitter to illuminate said portion of the holding site, and light reflected by the target object is further reflected by the beam splitter, toward the light detector.

18. An apparatus as claimed in claim 11, further including a beam splitter, wherein light from said source is reflected by said beam splitter toward said portion of said site and said light reflected by the target object travels through the beam splitter to the light detector.

19. An apparatus as claimed in claim 11, wherein the light detector is an image sensor or a power sensor.

20. An apparatus as claimed in claim 11, wherein the light is visible radiation.

21. An apparatus as claimed in claim 11, wherein light from the source is collimated or focused into a beam for illuminating said portion of the holding site.

22. An apparatus as claimed in claim 21, wherein the illuminating beam is approximately 0.02 to 0.5 mm wide at said portion of the holding site.

23. An apparatus as claimed in claim 11, wherein the target object is substantially transparent.

24. An apparatus as claimed in claim 11, wherein the target object has a refractive index not equal to 1.

25. An apparatus as claimed in claim 24, wherein the refractive index of the target is approximately 1.55.

26. An apparatus as claimed in claim 11, wherein either or both of the source of light and the light detector are located remotely from the collet.

27. An apparatus as claimed in claim 26, including a device to direct light between either or both of the source of light and the light detector and the holding site that is selected from the group consisting of optical fibers, mirrors and light guides.

28. A method as claimed in claim 1, further including the steps of:
passing said illuminating light through a beam splitter to illuminate said portion of the site, and
further reflecting said light reflected by the target object, by the beam splitter, toward the light detector.

29. A method as claimed in claim 1, further including the steps of:
reflecting said illuminating light from a source toward said portion of said site, by a beam splitter, and
passing said light reflected by the target object through the beam splitter to the light detector.

30. A method as claimed in claim 1, including the further step of:
collimating or focusing the illuminating light into a beam for illuminating said portion of the holding site.

31. A method as claimed in claim 30, wherein the collimated or focused illuminating beam is approximately 0.02 to 0.5 mm wide at said portion of the holding site.

32. A method as claimed in claim 1, wherein the detection of said reflected illuminated light is performed against a dark background.

33. A method as claimed in claim 1, wherein the target object is substantially transparent.

34. A method as claimed in claim 1, wherein the target object has a refractive index that is not equal to 1.

35. A method as claimed in claim 1, wherein the target object has a refractive index of approximately 1.55.

36. A method as claimed in claim 3, wherein the detection of light reflected from the holding site is made against a dark background.

37. A method as claimed in claim 3, wherein at least one of the source of the illumination and the detector move in tandem with the collet assembly.

38. A method as claimed in claim 3, wherein at least one of the source of the illumination and the detector is integral with the collet assembly.

39. An apparatus as claimed in claim 11, wherein at least one of the light source and the detector move in tandem with the collet assembly.

40. An apparatus as claimed in claim 11, wherein at least one of the light source and the detector is integral with the collet assembly.

* * * * *